United States Patent
Paul

(10) Patent No.: US 11,276,749 B2
(45) Date of Patent: Mar. 15, 2022

(54) HIGH DENSITY IC CAPACITOR STRUCTURE

(71) Applicant: pSemi Corporation, San Diego, CA (US)

(72) Inventor: Abhijeet Paul, Poway, CA (US)

(73) Assignee: pSemi Corporation, San Diego, CA (US)

(*) Notice: Subject to any disclaimer, the term of this patent is extended or adjusted under 35 U.S.C. 154(b) by 59 days.

(21) Appl. No.: 16/985,844

(22) Filed: Aug. 5, 2020

(65) Prior Publication Data

US 2021/0020736 A1    Jan. 21, 2021

Related U.S. Application Data

(63) Continuation of application No. 16/439,466, filed on Jun. 12, 2019, now Pat. No. 10,777,636.

(51) Int. Cl.
*H01L 23/52* (2006.01)
*H01L 49/02* (2006.01)
(Continued)

(52) U.S. Cl.
CPC .......... *H01L 28/60* (2013.01); *H01L 21/84* (2013.01); *H01L 23/5223* (2013.01); *H01L 27/1203* (2013.01); *H01L 29/0649* (2013.01)

(58) Field of Classification Search
CPC . H01L 28/60; H01L 27/1203; H01L 23/5223; H01L 21/84
See application file for complete search history.

(56) References Cited

U.S. PATENT DOCUMENTS

| 5,633,182 A | 5/1997 | Miyawaki et al. |
| 6,365,465 B1 | 4/2002 | Chan et al. |

(Continued)

FOREIGN PATENT DOCUMENTS

| EP | 1453093 | 9/2004 |
| WO | 2007120697 | 10/2007 |

(Continued)

OTHER PUBLICATIONS

Inoussa, Mouloucoulay, Office Action received from the USPTO dated Sep. 22, 2016 for U.S. Appl. No. 14/964,412, 7 pgs.

(Continued)

*Primary Examiner* — Nicholas J Tobergte
(74) *Attorney, Agent, or Firm* — Jaquez Land Greenhaus & McFarland LLP; John Land, Esq.

(57) ABSTRACT

High density integrated circuit (IC) capacitor structures and fabrication methods that increase the capacitive density of integrated capacitors with little or no reduction in Q-factor by using a stacked high-density integrated capacitor structure that includes substrate-contact ("S-contact") capacitor plates. Embodiments include a plurality of S-contact plates fabricated in electrical connection with a capacitor formed in a metal interconnect layer. Some embodiments include interstitial S-contact plates to provide additional capacitive density. Embodiments may also utilize single-layer transfer (SLT) and double-layer transfer (DLT) techniques to create ICs with high density, high Q-factor capacitors. Such capacitors can be beneficially combined with other structures made possible in SLT and DLT IC structures, such as metal interconnect layer capacitors and inductors, and one or more FETs having a conductive aligned supplemental gate. Embodiments are compatible with fabrication of CMOS SOI transistors, and are particularly suitable for radio frequency and analog applications.

12 Claims, 10 Drawing Sheets

DLT Structure

(51) Int. Cl.
  *H01L 29/06* (2006.01)
  *H01L 27/12* (2006.01)
  *H01L 21/84* (2006.01)
  *H01L 23/522* (2006.01)

(56) References Cited

U.S. PATENT DOCUMENTS

| | | | |
|---|---|---|---|
| 6,580,132 B1 | 6/2003 | Chan et al. | |
| 7,180,019 B1 | 2/2007 | Chiou et al. | |
| 7,414,289 B2 | 8/2008 | Wu et al. | |
| 8,048,753 B2 | 11/2011 | Zhou et al. | |
| 8,546,913 B2* | 10/2013 | Wada | H01L 27/11803 257/532 |
| 8,552,487 B2* | 10/2013 | Doris | H01L 27/10829 257/304 |
| 8,883,605 B2* | 11/2014 | Chen | H01L 28/90 438/386 |
| 9,312,369 B2* | 4/2016 | Tschumakow | H01L 29/66242 |
| 9,472,512 B1 | 10/2016 | Toh | |
| 9,780,210 B1 | 10/2017 | Goktepeli et al. | |
| 9,837,412 B2 | 12/2017 | Tasbas et al. | |
| 9,960,098 B2 | 5/2018 | Olson | |
| 10,573,674 B2 | 2/2020 | Paul et al. | |
| 10,580,903 B2 | 3/2020 | Yamada et al. | |
| 10,672,806 B2 | 6/2020 | Paul et al. | |
| 10,763,257 B2 | 9/2020 | Tasbas et al. | |
| 10,777,636 B1 | 9/2020 | Paul | |
| 2002/0125921 A1 | 9/2002 | Van Wershoven | |
| 2005/0037582 A1 | 2/2005 | Dennard et al. | |
| 2005/0242884 A1 | 11/2005 | Anand | |
| 2006/0006496 A1 | 1/2006 | Harris et al. | |
| 2006/0012006 A1 | 1/2006 | Tung et al. | |
| 2008/0020488 A1 | 1/2008 | Clevenger et al. | |
| 2008/0079037 A1 | 4/2008 | Zhu et al. | |
| 2008/0277778 A1 | 11/2008 | Furman et al. | |
| 2009/0010056 A1 | 1/2009 | Kuo | |
| 2009/0283854 A1 | 11/2009 | Levy et al. | |
| 2010/0244934 A1 | 9/2010 | Botula et al. | |
| 2011/0278581 A1 | 11/2011 | Inoue | |
| 2012/0193752 A1 | 8/2012 | Purushothaman et al. | |
| 2013/0037922 A1 | 2/2013 | Arriagada et al. | |
| 2014/0084391 A1* | 3/2014 | Lenive | H01L 28/40 257/414 |
| 2014/0191322 A1 | 7/2014 | Botula et al. | |
| 2014/0264468 A1 | 9/2014 | Cheng et al. | |
| 2014/0342529 A1 | 11/2014 | Goktepeli et al. | |
| 2015/0206964 A1 | 7/2015 | Cheng et al. | |
| 2015/0221714 A1* | 8/2015 | Gu | H01L 23/5383 257/532 |
| 2016/0020269 A1* | 1/2016 | Yang | H01L 22/34 438/18 |
| 2016/0141228 A1 | 5/2016 | Leobandung | |
| 2016/0336344 A1 | 11/2016 | Mason et al. | |
| 2016/0336990 A1 | 11/2016 | Petzold et al. | |
| 2017/0018497 A1* | 1/2017 | Zhai | H01L 24/17 |
| 2017/0170177 A1 | 6/2017 | Tasbas et al. | |
| 2017/0201291 A1 | 7/2017 | Gu et al. | |
| 2017/0373026 A1 | 12/2017 | Goktepeli | |
| 2018/0025970 A1 | 1/2018 | Kao et al. | |
| 2018/0151487 A1 | 5/2018 | Venugopal et al. | |
| 2018/0158405 A1 | 6/2018 | Agostinelli et al. | |
| 2018/0240797 A1 | 8/2018 | Yokoyama et al. | |
| 2019/0288119 A1 | 9/2019 | Yamada et al. | |
| 2020/0027908 A1 | 1/2020 | Paul et al. | |
| 2020/0227447 A1 | 7/2020 | Paul et al. | |

FOREIGN PATENT DOCUMENTS

| | | |
|---|---|---|
| WO | 2016183146 | 11/2016 |
| WO | 2017038403 | 3/2017 |
| WO | 2017099871 | 6/2017 |
| WO | 2019178004 | 9/2019 |
| WO | 2020018847 | 1/2020 |

OTHER PUBLICATIONS

Inoussa, Mouloucoulay, Office Action received from the USPTO dated Dec. 15, 2016 for U.S. Appl. No. 14/964,412, 12 pgs.
Inoussa, Mouloucoulay, Final Office Action received from the USPTO dated Jul. 18, 2017 for U.S. Appl. No. 14/964,412, 16 pgs.
Inoussa, Mouloucoulay, Notice of Allowance received from the USPTO dated Oct. 12, 2017 for U.S. Appl. No. 14/964,412, 12 pgs.
Tasbas, et al., Response filed in the USPTO on Nov. 7, 2016 for U.S. Appl. No. 14/964,412, 5 pgs.
Tasbas, et al., Response filed in the USPTO on Sep. 15, 2017 for U.S. Appl. No. 14/964,412, 12 pgs.
Tasbas, et al., Response filed in the USPTO on Apr. 13, 2017 for U.S. Appl. No. 14/964,412, 10 pgs.
Peregrine Semiconductor Corporation, Demand and Amendment filed in the EPO dated Jun. 28, 2017 for appln. No. PCT/US2016/054982, 24 pgs.
Le, Dung Anh, Office Action received from the USPTO dated Jun. 30, 2017 for U.S. Appl. No. 15/385,618, 9 pgs.
Abesingha, et al., Response filed in the USPTO dated Jul. 31, 2017 for U.S. Appl. No. 15/385,618, 9 pgs.
Le, Dung Anh, Notice of Allowance received from the USPTO dated Sep. 5, 2017 for U.S. Appl. No. 15/385,618, 31 pgs.
Peregrine Semiconductor Corporation, Response and English translation filed in the TIPO dated Apr. 25, 2017 for appln. No. 105131544, 17 pgs.
Peregrine Semconductor Corporation, Request for Substantive Examination and Voluntary Amendment filed in the SIPO for appln. No. 201610885245.6, 7 pgs.
Emam, Mostafa, "RF SOI: from Material to ICs—an Innnovative Characterization Approach", FD-SOI and RF-SOI Forum, Friday, Feb. 27, 2015, 35 pgs.
Roda, et al., "RF and Linear Performance of Commercial 200 mm Trap-Rich HR-SOI Wafers for SoC Applications", SiRF 2013, IEEE 2013, pp. 15-17.
Iperione, Analia, International Search Report and Written Opinion received from the EPO dated Dec. 14, 2016 for appln. No. PCT/US2016/054982, 16 pgs.
Botula, et al., "A Thin-film SOI 180nm CMOS RF Switch Technology", IBM Microelectronics, IEEE 2009, 9 pgs.
Sekar, et al., "Comparison of Substrate Effects in Sapphire, Trap-Rich and High Resistivity Silicon Substrates for RF-SOI Applications", IEEE 2015, pp. 37-39.
Neve, et al., "RF and Linear Performance of Commercial 200 mm trap-rich HR-SOI Wafers for SoC Applications", EEE 2013, pp. 15-17.
Kerr, et al., "Identification of RF Harmonic Distortion on Si Substrates and its Reduction using a Trap-Rich Layer", IEEE 2008, pp. 151-154.
Mazumder, Didarul A., Office Action received from the USPTO dated Feb. 11, 2019 for U.S. Appl. No. 15/920,321, 20 pgs.
Mazumder, Didarul A., Final Office Action received from the USPTO dated Jun. 5, 2019 for U.S. Appl. No. 15/920,321, 31 pgs.
Mazumder, Didarul A., Advisory Action received from the USPTO dated Aug. 19, 2019 for U.S. Appl. No. 15/920,321, 3 pgs.
Yamada, et al., "Semiconductor-on-Insulator Transistor with Improved Breakdown Characteristics", patent application filed in the USPTO on Mar. 13, 2018, U.S. Appl. No. 15/920,312, 45 pgs.
PSEMI Corporation, Preliminary Amendment filed in the USPTO dated Jun. 12, 2018 for U.S. Appl. No. 15/920,321, 5 pgs.
PSEMI Corporation, Response filed in the USPTO dated Feb. 22, 2019 for U.S. Appl. No. 15/920,321, 8 pgs.
PSEMI Corporation, Response filed in the USPTO dated Aug. 9, 2019 for U.S. Appl. No. 15/920,321, 15 pgs.
Englekirk, et al., "Managed Substrate Effects for Stabilized SOI FETS", U.S. Patent Application filed in the USPTO on May 19, 2017, U.S. Appl. No. 15/600,588, 62 pgs.
Celler, et al., "Frontiers of Silicon-on-Insulator", Journal of Applied Physics, vol. 93, No. 9, May 1, 2003, pp. 1955-4978 (25 pgs).
Le, Thao P., Office Action received from the USPTO dated Mar. 22, 2019 for U.S. Appl. No. 16/040,390, 11 pgs.
Le, Thao P., Office Action received from the USPTO dated Apr. 4, 2019 for U.S. Appl. No. 16/040,411, 6 pgs.

(56) References Cited

OTHER PUBLICATIONS

Le, Thao P., Notice of Allowance received from the USPTO dated Jun. 5, 2019 for U.S. Appl. No. 16/040,290, 7 pgs.

Le, Thao P., Office Action received from the USPTO dated Jun. 14, 2019 for U.S. Appl. No. 16/040,411, 5 pgs.

Meierewert, Klaus, Invitation to Pay Additional Fees and, Where Applicable, Protest Fee received from the EPO dated Jun. 28, 2019 for appln. No. PCT/US2019/021698, 13 pgs.

PSEMI Corporation, Response filed in the USPTO dated Jun. 18, 2019 for U.S. Appl. No. 16/040,411, 5 pgs.

PSEMI Corporation, Response filed in the USPTO dated Apr. 12, 2019 for U.S. Appl. No. 16/040,411, 6 pgs.

PSEMI Corporation, Preliminary Amendment iled in the USPTO dated Apr. 12, 2019 for U.S. Appl. No. 16/040,411, 6 pgs.

Paul, et al., "Thermal Extraction of Single Layer Transfer Integrated Circuits", application filed in the USPTO on Jul. 19, 2018, U.S. Appl. No. 16/040,295, 44 pgs.

Paul, et al., "SLT Integrated Circuit Capacitor Structure and Methods", application filed in the USPTO on Jul. 19, 2018, U.S. Appl. No. 16/040,390, 43 pgs.

Le, Thao P., Notice of Allowance received from the USPTO dated Aug. 20, 2019 for U.S. Appl. No. 16/040,390, 14 pgs.

Paul, et al., "High-Q Integrated Circuit Inductor Structure and Methods", application filed in the USPTO on Jul. 19, 2018, U.S. Appl. No. 16/040,411, 43 pgs.

PSEMI Corporation, Response filed in the USPTO dated Apr. 3, 2019 for U.S. Appl. No. 16/040,390, 9 pgs.

PSEMI Corporation, Preliminary Amendment filed in the USPTO dated Oct. 29, 2018 for U.S. Appl. No. 16/040,390, 5 pgs.

Tobergte, Nicholas J., Notice of Allowance received from the USPTO dated Jun. 4, 2020 for U.S. Appl. No. 16/439,466, 28 pgs.

Le, Thao P., Notice of Allowance received from the USPTO dated Jan. 31, 2020 for U.S. Appl. No. 16/040,411, 23 pgs.

Mazumder, Didarul A., Notice of Allowance received from the USPTO dated Nov. 20, 2019 for U.S. Appl. No. 15/920,321, 13 pgs.

Mazumder, Didarul A., Office Action received from the USPTO dated Oct. 18, 2019 for U.S. Appl. No. 15/920,321, 20 pgs.

Le, Thao P., Office Action received from the USPTO dated Aug. 13, 2019 for U.S. Appl. No. 16/040,411, 14 pgs.

Le, Thao P., Notice of Allowance received from the USPTO dated Dec. 18, 2019 for U.S. Appl. No. 16/040,390, 17 pgs.

Hoffmann, Niels, International Search Report and Written Opinion received from the EPO dated Oct. 8, 2019 for appln. No. PCT/US2019/021698, 18 pgs.

Wirner, Christoph, International Search Report and Written Opinion received from the EPO dated Oct. 28, 2019 for appln. No. PCT/US2019/042486, 14 pgs.

PSEMI Corporation, Preliminary Amendment filed in the USPTO dated Aug. 19, 2019 for U.S. Appl. No. 16/439,466, 5 pgs.

PSEMI Corporation, Amendment After Allowance filed in the USPTO dated Jun. 9, 2020 for U.S. Appl. No. 16/439,466, 6 pgs.

\* cited by examiner

SLT Structure

DLT Structure

HIGH DENSITY IC CAPACITOR STRUCTURE

CROSS-REFERENCE TO RELATED APPLICATIONS—CLAIM OF PRIORITY

The present application is a continuation of, and claims priority to, co-pending and commonly assigned U.S. patent application Ser. No. 16/439,466, filed Jun. 12, 2019, entitled "High Density IC Capacitor Structure", and the contents of said application is incorporated herein by reference in its entirety.

This invention may be related to the following patent applications, all assigned to the assignee of the present invention, the contents of all of which are incorporated by reference:

- U.S. patent application Ser. No. 14/964,412, filed Dec. 9, 2015, entitled "S-Contact for SOI" (now U.S. Pat. No. 9,837,412, issued Dec. 5, 2017);
- Co-pending U.S. patent application Ser. No. 15/920,321, filed Mar. 13, 2018, entitled "Semiconductor-on-Insulator Transistor with Improved Breakdown Characteristics" (now U.S. Pat. No. 10,580,903, issued Mar. 3, 2020);
- Co-pending U.S. patent application Ser. No. 16/040,411, filed Jul. 19, 2018, entitled "High-Q Integrated Circuit Inductor Structure and Methods" (now U.S. Pat. No. 10,672,806, issued Jun. 2, 2020); and
- Co-pending U.S. patent application Ser. No. 16/040,390, filed Jul. 19, 2018, entitled "SLT Integrated Circuit Capacitor Structure and Methods" (now U.S. Pat. No. 10,573,674, issued Feb. 25, 2020).

BACKGROUND

(1) Technical Field

This invention relates to electronic integrated circuits, and more particularly to electronic integrated circuits having integrated capacitor structures.

(2) Background

Virtually all modern electronic products—including laptop computers, mobile telephones, and electric cars—utilize complementary metal oxide semiconductor (CMOS) transistor integrated circuits (ICs), and in many cases CMOS ICs fabricated using a semiconductor-on-insulator process, such as silicon-on-insulator (SOI) or germanium-on-insulator. Common IC components are capacitors, which are used in numerous critical circuits such as high, low, and bandpass filters; for setting R-C time constants and time delays; for blocking direct current (DC) while passing alternating current (AC); for storing charge; for bypassing noise; and for many other well-known functions. For critical radio frequency (RF) and analog circuits, high quality factor capacitors are generally required and often effectively determine the performance of an RF or analog IC.

Capacitors at their most basic are essentially a dielectric (insulating) material sandwiched between two conductive layers (commonly referred to as "plates"). The plates are often labeled as positive (+) or negative (−). However, it will be clear to anyone of ordinary skill that either side of a basic capacitor can be charged to a positive or negative voltage with respect to the other side; indeed, when an RF signal is applied to a capacitor, neither plate charges to a DC positive or negative voltage unless there is a DC voltage component in the signal. Accordingly, in this disclosure, the symbols "+" and "−" and the terms "positive" and "negative" are used simply to distinguish first and second alternate plates of a capacitor.

In IC's, capacitors are preferably designed for high capacitive density to minimize cost impact on an IC, and to exhibit a high quality factor Q ("Hi-Q"). Capacitive density means the amount of capacitance per unit area of an IC, while quality factor means how much energy a capacitor can store as compared to how much energy the capacitor dissipates in a charge and discharge cycle. Capacitive density is often maximized by utilizing a thin dielectric layer between conductive layers or structures. Quality factor is often maximized by utilizing low resistivity materials as the conductive layers or structures and low loss dielectrics as the insulating layer.

With respect to ICs, one major issue with passive components (e.g., capacitors, inductors, and resistors) in general is that they are relatively large, especially as compared to transistors. However, making capacitors smaller tends to reduce their quality factor, which often must meet or exceed a target level. As an example, a small IC capacitor structure can be formed by utilizing the capacitance inherent in the gate structure of a CMOS transistor, since the gate structure typically includes a very thin and very high quality dielectric (good for capacitive density). However, the conductive plates of a typical gate structure that bracket the dielectric are a relatively thin polysilicon/silicide sandwich on one side and underlying lightly doped silicon on the other side, neither of which is a good conductor when compared to copper or aluminum available for metal interconnects commonly used in an IC.

Accordingly, most Hi-Q capacitors in ICs are made of two layers of interconnect metal sandwiching a relatively thick interlevel dielectric. The thick interlevel dielectric can consume substantial IC area for a selected capacitance, and therefore drive up IC cost. A Hi-Q factor specification requirement is typically high enough that the increased cost from a thicker dielectric must be absorbed. It is therefore very valuable to increase the capacitive density of integrated capacitors while maintaining a high quality factor.

One approach to fabricating integrated Hi-Q capacitors with reasonably high capacitive density is to use thinner interlevel insulators (also known as "MIM" capacitors) or interdigitated structures formed from metal interconnects. Thinner interlevel dielectrics require special processing and may not be available in all processes, so interdigital capacitors are often used. For example, FIG. 1A is a top view of a stylized prior art integrated capacitor structure formed in a single metal interconnect layer, and FIG. 1B is a stylized cross-sectional view of a prior art stacked integrated capacitor structure formed in three metal interconnect layers of a typical SOI IC structure 100. The SOI structure 100 includes a substrate 102, a buried-oxide (BOX) layer 104, and a fabrication region 106 (note that the dimensions for the elements of the SOI IC structure 100 are not to scale; some dimensions have been exaggerated for clarity or emphasis—in particular, the BOX layer 104 is generally much thicker than the fabrication region 106). The substrate 102 is typically a semiconductor material such as silicon. The BOX layer 104 is a dielectric, and is often $SiO_2$ formed as a "top" surface of the silicon substrate 102, such as by oxidation, layer transfer, or implantation. The fabrication region 106 may include some diverse combination of implants and/or regions (e.g., islands or regions of active material and/or of dielectric material) and/or layers (including overlaying layers) that may include dopants, dielectrics, polysilicon, metal and/or conductive wiring, passivation, and other materials to form active and/or passive electronic components and/or mechanical structures, including field effect transistors (FETs) and particularly MOSFETs.

Above the fabrication region 106 is a region of interlayer dielectric (ILD) 108, which is typically formed in multiple passes so as to enable formation and separation of other structures, particularly one or more metal interconnect layers Mn and vertical conductive vias 130. In FIG. 1B, three metal interconnect layers M1, M2, and M3 are shown.

Referring to FIG. 1A, a lateral capacitor 120 can be formed within a metal interconnect layer by creating positive (+) and negative (−) interdigitated structures 122, 124 spaced apart by ILD 108, in known fashion (e.g., by masking and etching the metal interconnect layer). While only a few "fingers" 122a, 124a are shown for each interdigitated structure 122, 124, the number of fingers 122a, 124a may be increased to increase the total capacitance of the lateral capacitor 120.

While an integrated capacitor may comprise a lateral capacitor 120 formed in only one metal interconnect layer (e.g., M1 alone), higher capacitive density can be achieved by forming multiple lateral capacitors 120x in metal interconnect layers stacked over each other so as to create vertical capacitive interactions between the lateral capacitors 120x. For example, in FIG. 1B, three lateral capacitors 120a, 120b, 120c, formed respectively in metal interconnect layers M1, M2, and M3, are stacked vertically with respect to each other to increase capacitive density without significantly increasing the IC area consumed by the entire structure. Preferably, the positive and negative fingers 122a, 124a of the M2 layer lateral capacitor 120b in FIG. 1B are positioned so as to alternate with the positive and negative fingers 122a, 124a of the M1 and M3 layer lateral capacitors 120a, 120c. Further, the positive (+) and negative (−) interdigitated structures 122, 124 of the lateral capacitors 120x of every other layer are coupled together. In FIG. 1B, the M1 and M3 layer lateral capacitors 120a, 120c are coupled by vias 130 to a common transfer region 132 in the M2 layer that is electrically isolated from the M2 layer lateral capacitor 120b (a direct connection between the M1 and M3 layers is generally not possible with common fabrication technologies for making vias). While only a few layers M1-M3 of stacked lateral capacitors 120x are shown in FIG. 1B, additional metal interconnect layers may be used for additional stacked lateral capacitors 120x to increase the total capacitance and capacitive density of the combined capacitor structure.

FIG. 1C is a cross-sectional view through line A-A in FIG. 1B showing the combined capacitor structure for the example stacked lateral capacitors 120x. The positive and negative fingers 122a, 124a of the M2 layer lateral capacitor 120b alternate with respect to the positive and negative fingers 122a, 124a of the vertically separated M1 and M3 layer lateral capacitors 120a, 120c (only three sets of adjacent fingers are shown). The arrangement shown in FIG. 1C has a significantly improved capacitive density by ensuring that, for each finger 122a, 124a, every adjacent finger is of opposite polarity, thereby maximizing the number of lateral and vertical capacitive elements for each finger. The vertical capacitance between layers generally provides a larger contribution to the overall capacitance of the combined capacitor structure than does the positive and negative fingers 122a, 124a of each lateral capacitor 120x, as suggested by the relative size of the capacitor symbols in FIG. 1C.

While the stacked lateral capacitor structure shown in FIGS. 1A-1C are known, ever higher capacitive density is desirable in IC's, particularly IC's for RF and analog applications. It is therefore a goal of the present invention to increase the capacitive density of integrated capacitors with little or no reduction in Q-factor. It is also a goal of the present invention that such high capacitive density and Hi-Q capacitors be compatible with fabrication of CMOS SOI transistors since such transistors are a preferred form of circuit technology for RF applications.

SUMMARY

The present invention encompasses high density integrated circuit (IC) capacitor structures and fabrication methods that increase the capacitive density of integrated capacitors with little or no reduction in Q-factor by using a stacked high-density integrated capacitor structure that includes substrate-contact ("S-contact") fin capacitor plates. An S-contact is a low resistivity conductive material, such as polysilicon and/or various metals used to form a via extending vertically through at least a portion of the buried-oxide (BOX) layer of a silicon-on-insulator (SOI) IC structure.

More particularly, embodiments include two or more S-contact plates fabricated in electrical connection with corresponding fingers or busbars of a lateral capacitor formed in a metal interconnect layer. Some embodiments may include interstitial S-contact plates to provide additional capacitive density.

Embodiments of the present invention are compatible with fabrication of CMOS SOI transistors, and are particularly suitable for radio frequency (RF) and analog applications. Embodiments of the present invention may also utilize single-layer transfer (SLT) and double-layer transfer (DLT) techniques to create ICs with high density, high Q-factor capacitors. Such capacitors can be beneficially combined with other structures made possible in SLT and DLT IC structures, such as metal interconnect layer capacitors and inductors, and one or more FETs having a conductive aligned supplemental ("CAS") gate.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

Figure 1A:
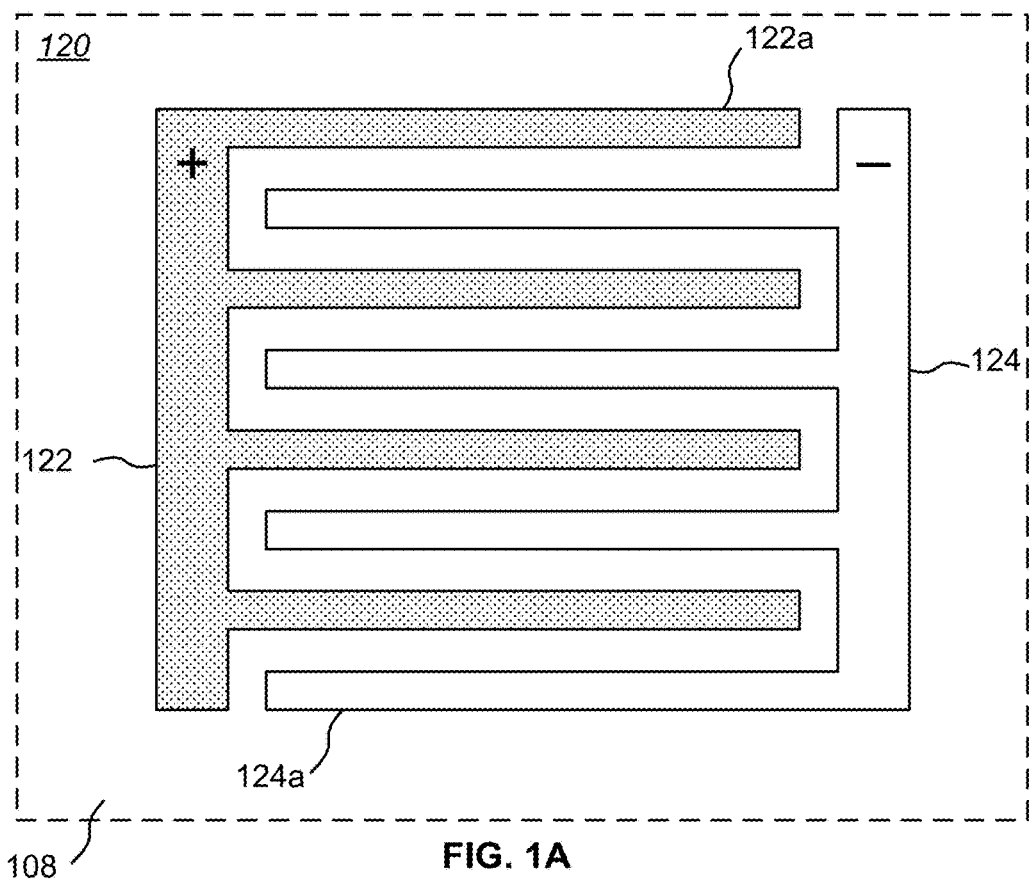
FIG. 1A is a top view of a stylized prior art integrated capacitor structure formed in a single metal interconnect layer.

The present invention encompasses high density integrated circuit (IC) capacitor structures and fabrication methods that increase the capacitive density of integrated capacitors with little or no reduction in Q-factor by using a stacked high-density integrated capacitor structure that includes substrate contact (S-contact) fin capacitor plates. Embodiments of the present invention are compatible with fabrication of CMOS SOI transistors, and are particularly suitable for radio frequency (RF) and analog applications. Embodiments of the present invention may also utilize single-layer transfer (SLT) and double-layer transfer (DLT) techniques to create ICs with high density, Hi-Q capacitors that can be beneficially combined with other structures made possible in SLT and DLT IC structures.

Relative Dimensions and Orientations in the Drawings

With respect to the figures referenced in this disclosure, note that the dimensions for the various elements are not to scale; some dimensions have been greatly exaggerated vertically and/or horizontally for clarity or emphasis. In addition, references to orientations and directions (e.g., "top", "bottom", "above", "below", "lateral", etc.) are relative to the example drawings, and not necessarily absolute orientations or directions.

S-Contact Fin Capacitor Embodiments

Figure 2A:
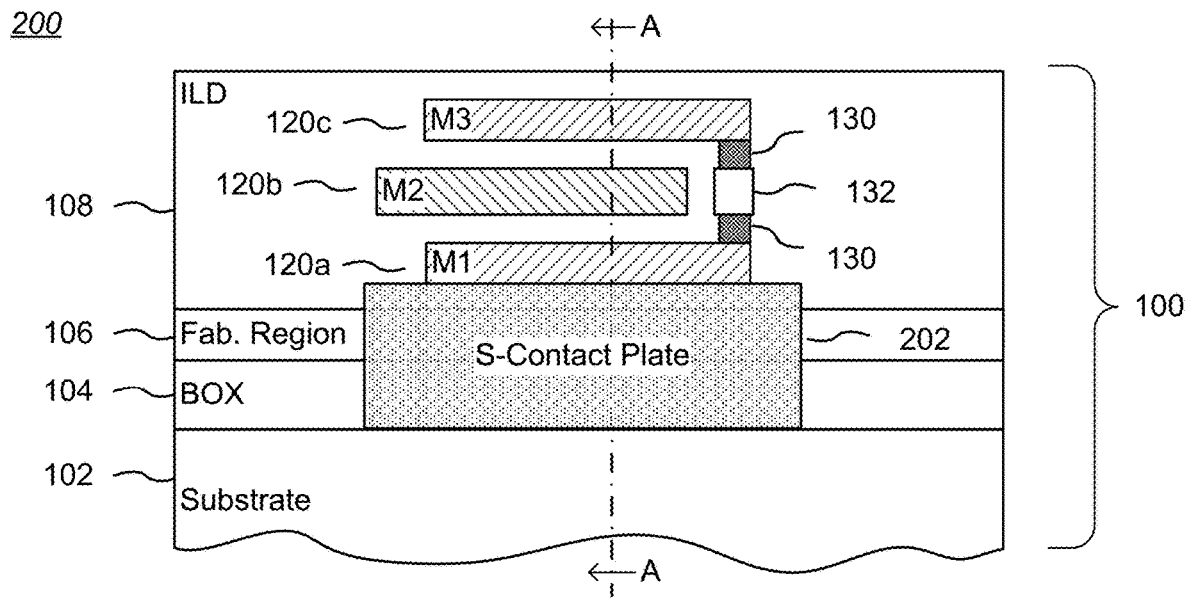
FIG. 2A is a stylized cross-sectional view of a first embodiment of a stacked high-density integrated capacitor structure in accordance with the present invention.
Figure 2B:
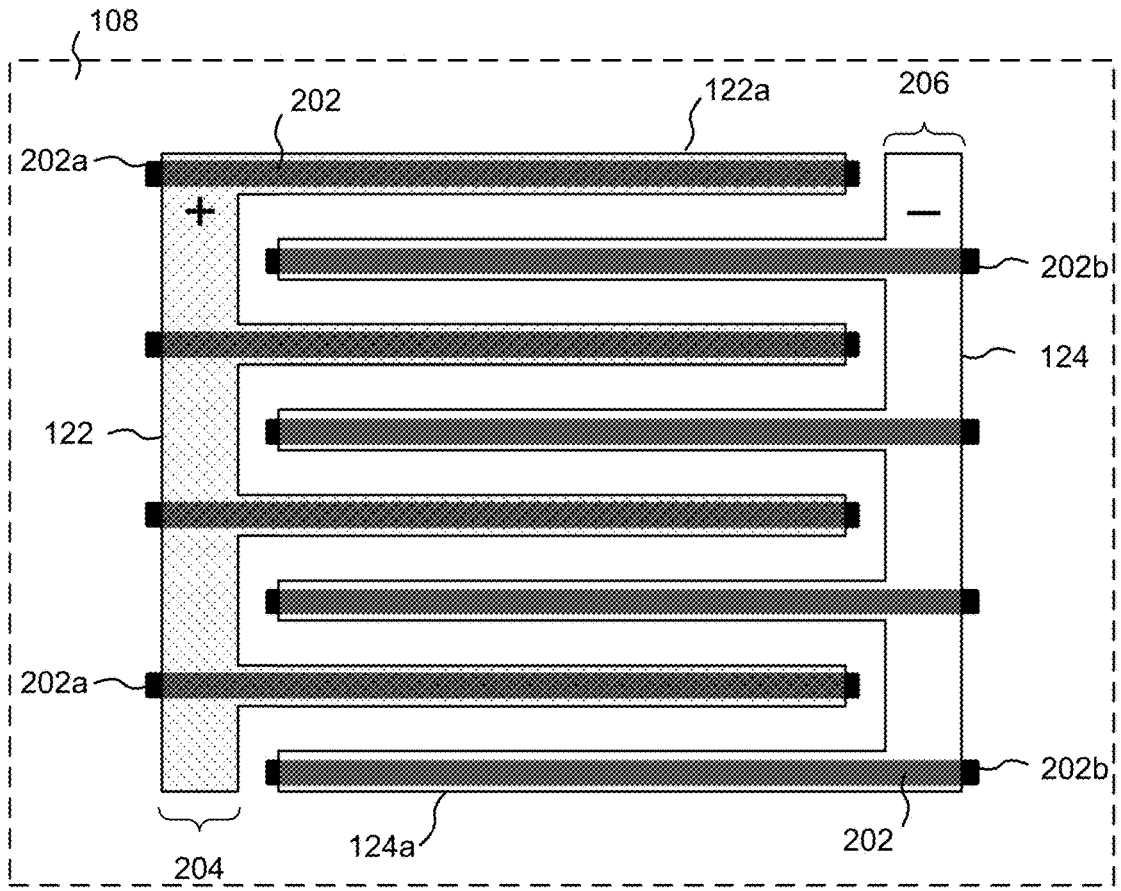
FIG. 2B is a top view of the stacked high-density integrated capacitor structure of FIG. 2A, taken at the M1 metal interconnect layer.

FIG. 2A is a stylized cross-sectional view of a first embodiment of a stacked high-density integrated capacitor structure 200 in accordance with the present invention. In the illustrated example, three lateral capacitors 120a, 120b, 120c are formed in corresponding metal interconnect layers M1, M2, and M3. However, as noted above, an integrated capacitor structure 200 may comprise fewer (e.g., only one) lateral capacitors, or may comprise a number of lateral capacitors stacked vertically with respect to each other to increase capacitive density without significantly increasing the IC area consumed by of the entire structure. FIG. 2B is a top view of the stacked high-density integrated capacitor structure of FIG. 2A, taken at the M1 metal interconnect layer. However, note that the metal interconnect layer used for the first lateral capacitor in an integrated capacitor structure may be other than the M1 metal interconnect layer (e.g., an integrated capacitor structure may have a first lateral capacitor formed in the M2 metal interconnect layer).

Figure 1B:
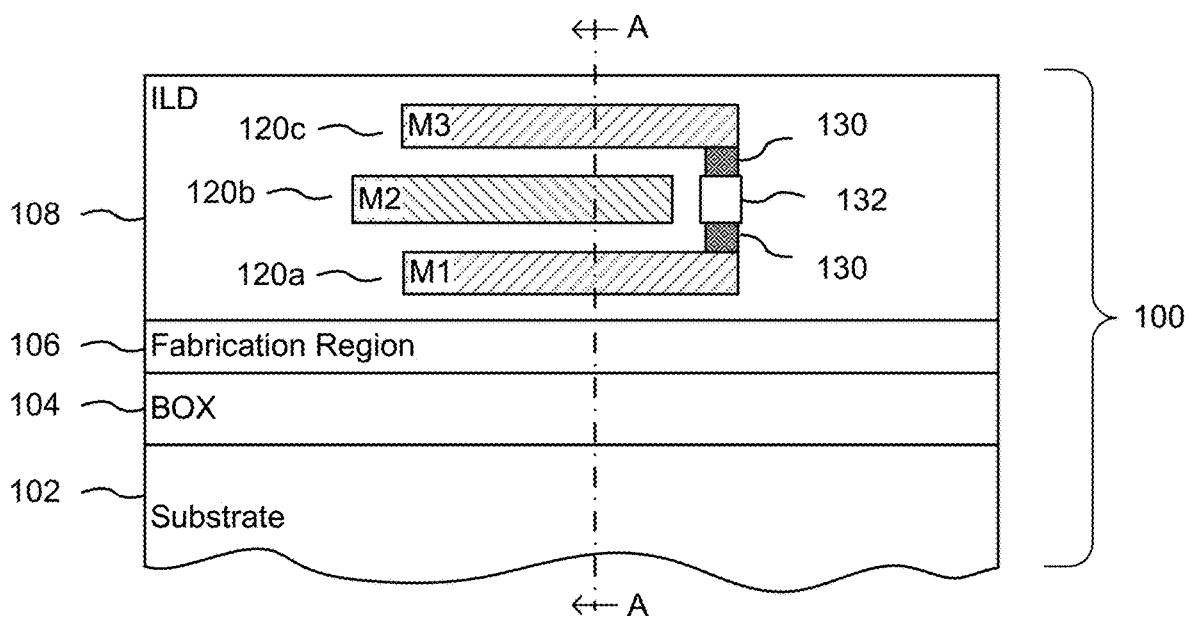
FIG. 1B is a stylized cross-sectional view of a prior art stacked integrated capacitor structure formed in three metal interconnect layers of a typical SOI IC structure.
Figure 1C:
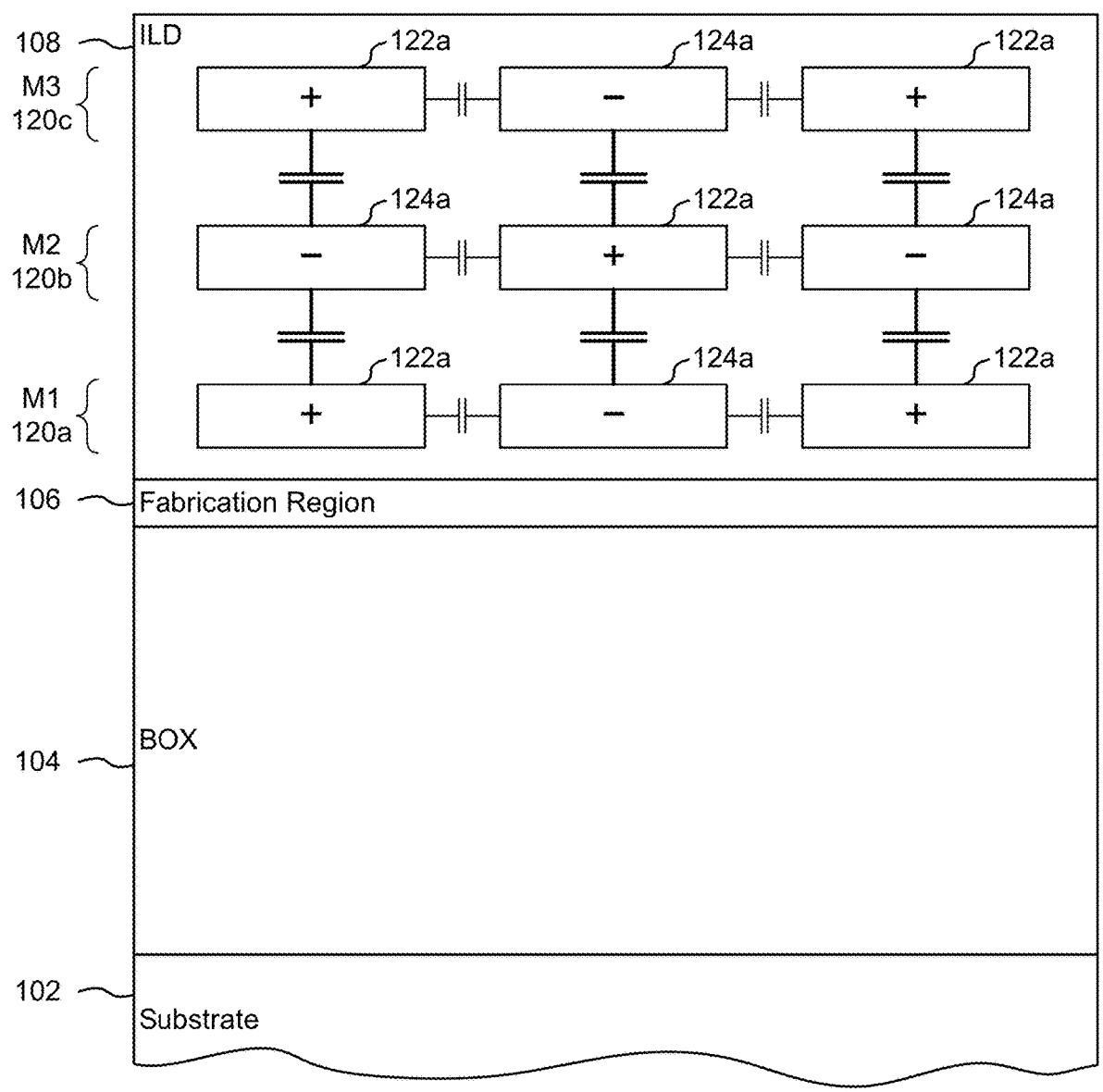
FIG. 1C is a cross-sectional view through line A-A in FIG. 1B showing the combined capacitor structure for the example stacked lateral capacitors.

The embodiment shown in FIGS. 2A and 2B are similar in general structure to the integrated capacitor structure of FIGS. 1B and 1A. However, in the embodiment illustrated in FIGS. 2A and 2B, two or more substantially parallel substrate-contact ("S-contact") plates 202 are fabricated in electrical connection and general co-alignment with corresponding fingers 122a, 124a of the lateral capacitor 120a formed in the M1 metal interconnect layer, thereby substantially increasing the capacitive density of the overall capacitor structure 200 over that of the prior art capacitors of FIGS. 1A-1C.

In general, an S-contact is a low resistivity conductive material used to form a via penetrating vertically through the fabrication region 106 (but electrically isolated from other elements of the fabrication region 106 by passing through, for example, a dielectric region of the fabrication region 106) and through at least a portion of the BOX layer 104. The low resistivity conductive material may be, for example, polysilicon, metal (e.g., tungsten, copper, etc.), or conductive ceramic (e.g., titanium nitride). As taught in the "S-Contact for SOI" patent referenced above, an original use of S-contacts was to enable electrical connection from circuitry or electrical connections above the BOX layer 104 (such as metal interconnects within the ILD 108) to the substrate 102 below the BOX layer 104 for improved protection against charge injection of a semiconductor device. S-contacts can be fabricated, for example, by masking, etching, and filling through one or more previously formed layers. Further details on methods of fabricating S-contacts in general may be found in the "S-Contact for SOI" patent referenced and incorporated above.

While S-contacts are often cylindrically-shaped structures, they can also be patterned to be nearly any shape, including square or rectangular. In particular, they may be fabricated as parallel plates extending down through the BOX layer, as shown in FIGS. 2A and 2B. Fabrication may be done, for example, by masking, etching, and filling trenches through one or more previously formed layers. Since the parallel S-contact plates 202 are made of low resistivity conductive material, electrical connection (which is preferably by direct contact) with corresponding fingers 122a, 124a of the lateral capacitor 120a in the M1 metal interconnect layer forms a parallel plate capacitor.

Notably, adding S-contact plates 202 effectively increases the vertical area and hence capacitive density of the M1 lateral capacitor 120a, but with little or no additional (and valuable) surface area for the integrated capacitor structure 200. Depending on process parameters, an increase in capacitive density of tens of percent can be achieved. While capacitive density increases, the Q-factor for the integrated capacitor structure 200 may either remain the same or be somewhat degraded compared to a capacitor structure lacking S-contact plates 202, depending on the resistivity of the materials used to form the S-contact plates 202 in a particular IC fabrication process flow.

In an alternative configuration, S-contact plates 202 of common polarity may be connected together at one end 202a, 202b by corresponding "busbar" sections 204, 206 of the metal interconnect layer 120a electrically connected to the S-contact plates 202; that is, the fingers 122a, 124a of the lateral capacitor 120a need not be formed. Thus, a vertical "fin" capacitor can be fabricated using two or more essentially parallel S-contact plates 202 alone. However, inclusion of fingers 122a, 124a in the metal interconnect layer to form the lateral capacitor 120a generally increases the capacitive density of the capacitor structure and provides a lower resistance electrical connection to the S-contact plates 202.

Figure 2C:
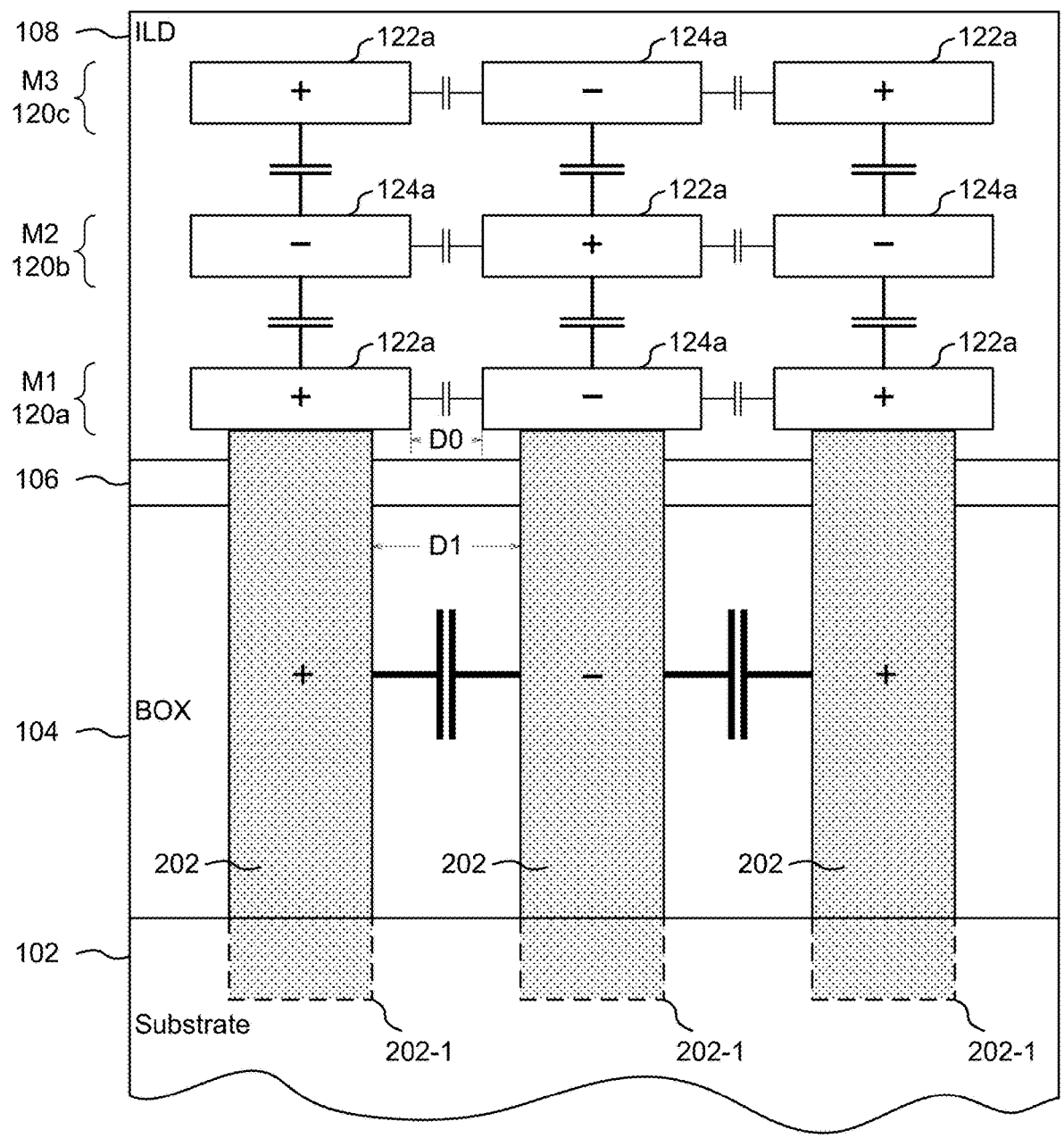
FIG. 2C is a cross-sectional view through line A-A in FIG. 2A showing a stacked high-density integrated capacitor structure that includes a set of vertical S-contact plates and three stacked lateral capacitors.

FIG. 2C is a cross-sectional view through line A-A in FIG. 2A showing a stacked high-density integrated capacitor structure 210 that includes a set of vertical S-contact plates 202 and three stacked lateral capacitors 120a, 120b, 120c. The positive and negative fingers 122a, 124a of the M2 layer lateral capacitor 120b alternate with respect to the positive and negative fingers 122a, 124a of the vertically separated M1 and M3 layer lateral capacitors 120a, 120c so that every adjacent finger is of opposite polarity, thereby maximizing the number of lateral and vertical capacitive storage elements for each finger (again, only three sets of adjacent fingers are shown). In addition, the S-contact plates 202 electrically connected to the fingers 122a, 124a of the M1 layer lateral capacitor 120a vertically extend the area of the M1 layer lateral capacitor 120a and provide a substantial increase in overall capacitance, as suggested by the relative size of the capacitor symbols in FIG. 2C.

In the example of FIGS. 2A and 2C, the S-contact plates 202 are formed through the fabrication region 106 and the BOX layer 104 and in contact with the substrate 102. If the S-contact plates 202 extend through the BOX layer 104, then depending on the resistivity or type of substrate 102 being used, there may be shorting between the S-contact plates 202, thereby creating relatively lossy current paths. Such current paths will reduce the Q-factor, or Q, of the resulting capacitors. A high Q factor may not be critical for some applications, while a high Q is often critical in other applications, such as RF applications. Accordingly, for the integrated capacitor structure 200 of FIGS. 2A and 2C, a high resistivity substrate 102 is preferable. For example, a high resistivity substrate 102 with a trap-rich layer may be sufficiently non-conductive to permit full extension of the S-contact plates 202 through the BOX layer 104 all the way to the substrate 102. In some applications, the S-contact plates 202 may even extend into the substrate 102, as indicated by the dotted extensions 202-1 of the S-contact plates 202, particularly if a dielectric substrate is used.

Figure 2D:
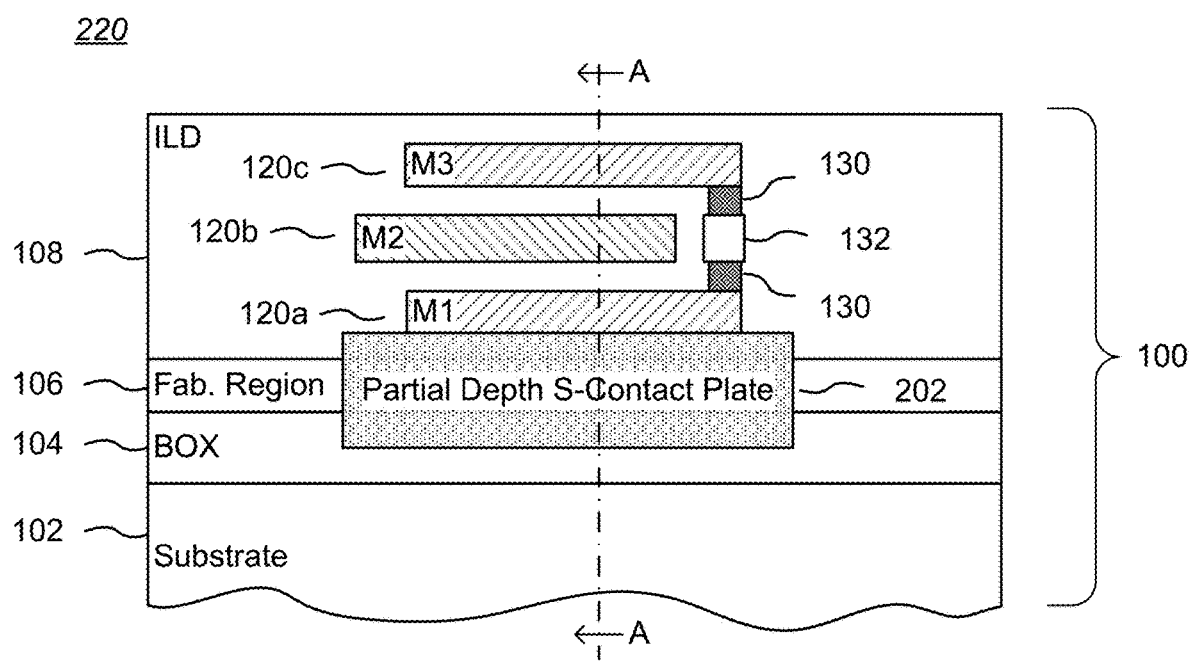
FIG. 2D is a stylized cross-sectional view of a second embodiment of a stacked high-density integrated capacitor structure in accordance with the present invention.

As an alternative solution, partial-depth S-contact plates 202 may be used to maintain a Hi-Q characteristic. For example, FIG. 2D is a stylized cross-sectional view of a second embodiment of a stacked high-density integrated capacitor structure 220 in accordance with the present invention. Similar to the general structure to the integrated capacitor structure of FIG. 2A, in the illustrated embodiment, the S-contact plates 202 are formed so as to stop short of contact with the substrate 102 and thus only partially penetrate the BOX layer 104. For example, when masking, etching, and filling trenches through one or more previously formed layers, the etching process may be stopped before complete penetration of the BOX layer 104. Note that if S-contacts contacting the substrate 102 are needed for other purposes, separate masking, etching, and filling steps may be needed to form partial-depth S-contact plates 202.

Process Dependent Variations

The available fabrication processes in IC foundries may have design rules that vary as to the ability to fabricate S-contact plates 202 and the fingers 122a, 124a of a metal interconnect layer lateral capacitor at the same pitch.

Figure 3:
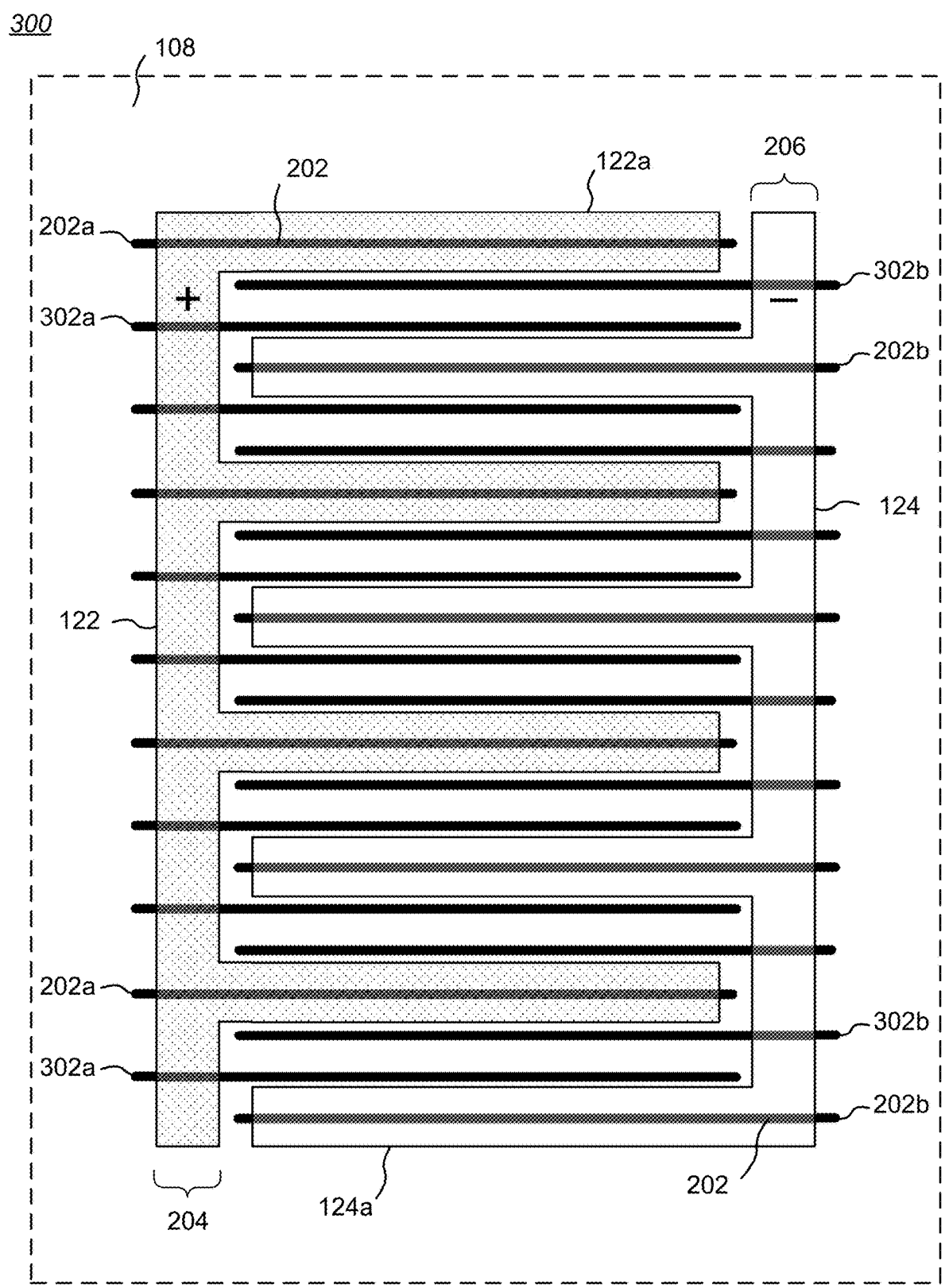
FIG. 3 is a top view of a stacked high-density integrated capacitor structure showing interstitial positive and negative S-contact plates between S-contact plates aligned with the fingers of a lateral capacitor.

It may be that applicable design rules allow S-contact plates 202 to be fabricated at a closer pitch than the fingers of a lateral capacitor. In this case, further improvements in capacitive density may be achieved by adding additional S-contact plates between the plates shown in FIG. 2B. For example, FIG. 3 is a top view of a stacked high-density integrated capacitor structure 300 showing interstitial positive S-contact plates 302a and negative S-contact plates 302b between S-contact plates 202 aligned with the fingers 122a, 124a of a lateral capacitor. Interstitial positive S-contact plates 302a and interstitial negative S-contact plates 302b are shown respectively connected at one end by corresponding polarity "bus-bar" sections 204, 206 of the metal interconnect layer. The S-contact plates 202 underlying the fingers 122a, 124a of the lateral capacitor may be in contact with the fingers along their full length, or may only be connected together at one end 202a, 202b by corresponding "bus-bar" sections 204, 206 of the metal interconnect layer. Decreasing the distance between the S-contact plates 202, 302a, 302b increases the capacitive contribution of those plates, and of course the S-contact plates 202, 302a, 302b have substantial area, thus increasing the capacitive density of the integrated capacitor structure 300. Note that while FIG. 3 shows two interstitial S-contact plates 302a, 302b between each pair of adjacent fingers 122a, 124a, the number of such interstitial S-contact plates may be as few as one or more than two, although connections to corresponding "bus-bar" sections 204, 206 of the metal interconnect layer may become more intricate.

As a result of some applicable design rules in some fabrication processes, adding interstitial S-contact plates 302a, 302b may force an increased distance between the fingers 122a, 124a of the corresponding lateral capacitor in order to achieve a minimum horizontal distance between the vertical S-contact plates 302a, 302b. Increased inter-finger distance will decrease the capacitive contribution from the fingers. However, in many designs, the net result will be increased total capacitance due to the large area of the S-contact plates 202, 302a, 302b. That is, the inter-plate capacitance may increase faster than the inter-finger capacitance decreases. Note that this issue essentially arises only with respect to the metal interconnect layer in contact with the S-contact plates 202 (e.g., the M1 metal interconnect layer); stacked lateral capacitors in other metal interconnect layers may be spaced more optimally to provide a larger capacitive contribution.

Figure 4:
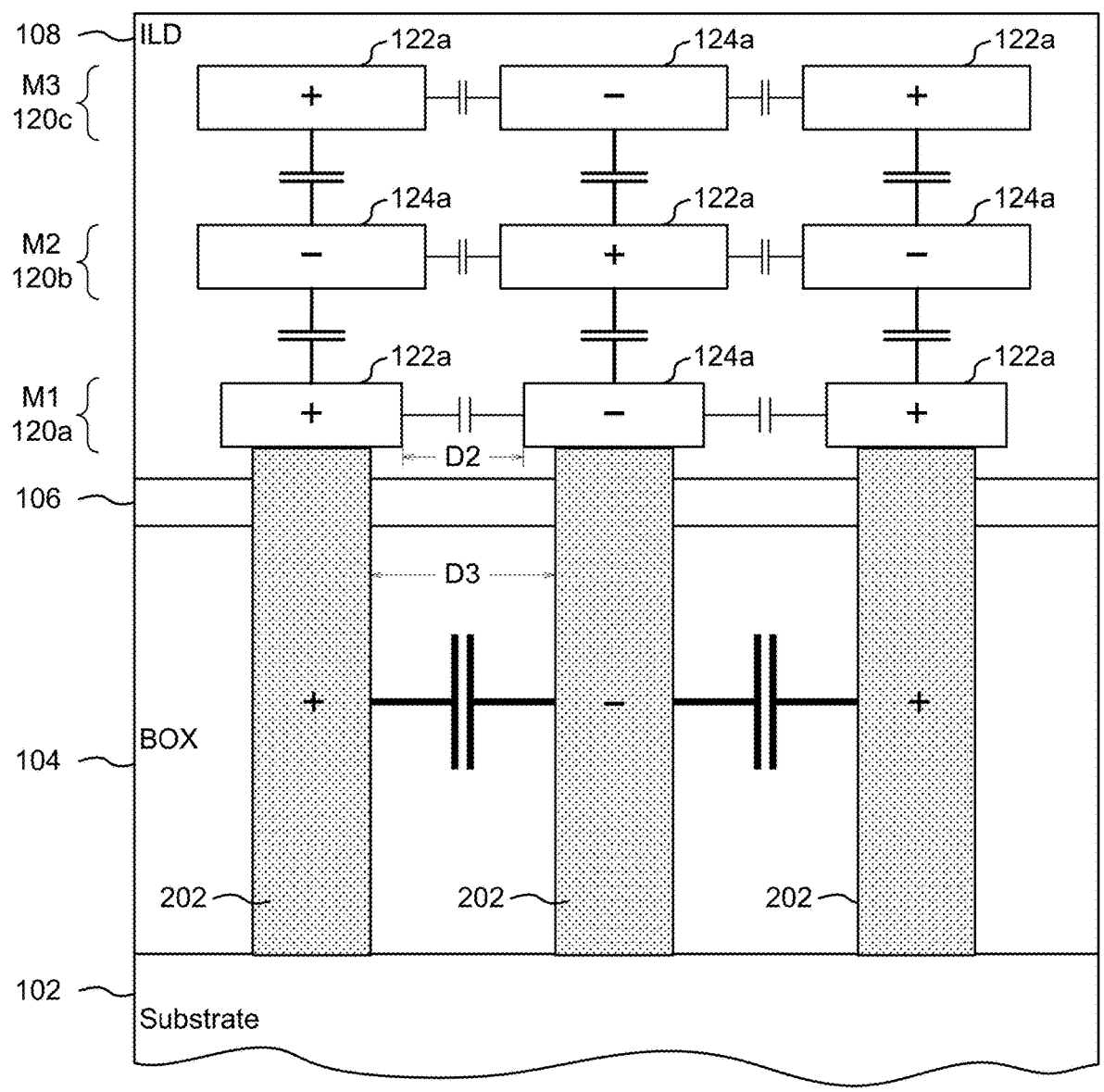
FIG. 4 is a cross-sectional view through line A-A in FIG. 2A showing a pitch-constrained stacked high-density integrated capacitor structure.

In another case, it may be that applicable design rules mandate that the pitch between S-contact plates 202 cannot be fabricated as close as the spacing between fingers 122a, 124a of a lateral capacitor. For example, FIG. 4 is a cross-sectional view through line A-A in FIG. 2A showing a pitch-constrained stacked high-density integrated capacitor structure 400. The illustrated integrated capacitor structure 400 includes a set of vertical S-contact plates 202 and three stacked lateral capacitors 120a, 120b, 120c. In order to conform to the design rules for S-contact plates in the example process, the pitch D3 between adjacent S-contact plates 202 is greater than the pitch D1 between adjacent S-contact plates 202 in FIG. 2C (note that FIG. 4 and FIG. 2C have different horizontal scales). The fingers 122a, 124a in the M1 layer lateral capacitor 120a align over the S-contact plates 202, and making those fingers the same width as the fingers of the lateral capacitor 120a in FIG. 2C means that the pitch D2 in FIG. 4 is greater than the pitch D0 in FIG. 2C. While the greater distance between the fingers 122a, 124a of the lateral capacitor 120a decreases the capacitive contribution from those fingers, in general the net result will be increased total capacitance due to the large area of the S-contact plates 202.

The fingers 122a, 124a for the lateral capacitors 120b, 120c in the M2 and M2 metal interconnect layers may be wider and closer together than the fingers 122a, 124a of the lateral capacitor 120a in the M1 metal interconnect layer, since the upper layer lateral capacitors 120*b*, 120*c* are not subject to the pitch constraints imposed by the vertical S-contact plates 202. Accordingly, the decreased spacing between the fingers 122*a*, 124*a* of the lateral capacitors 120*b*, 120*c* in the M2 and M3 (and higher) layers increases their capacitive contribution.

Layer Transfer Embodiments

High density integrated circuit (IC) capacitor structures having S-contact fin capacitor plates are compatible with both single layer transfer (SLT) and double layer transfer (DLT) fabrication processes. In the SLT process, an SOI transistor is fabricated in conventional fashion on a silicon substrate (up to a point), then the entire SOI transistor structure is flipped upside down onto a "handle wafer", with the original substrate then being removed, thereby exposing the BOX layer. A second ILD layer is generally formed on the newly exposed BOX layer for insulation and environmental protection. In the DLT process, an SOI transistor is fabricated in conventional fashion on a silicon substrate (up to a point), then flipped onto a first handle wafer, at which point the original silicon substrate is removed. The exposed BOX layer (which may be first covered with a protective layer) is then bonded to a second handle wafer and the first handle wafer is removed. Additional steps may be performed, such as flip-chip solder bumping (e.g., to the metal interconnect layers) and die attachment to a printed circuit board (PCB).

Figure 5:
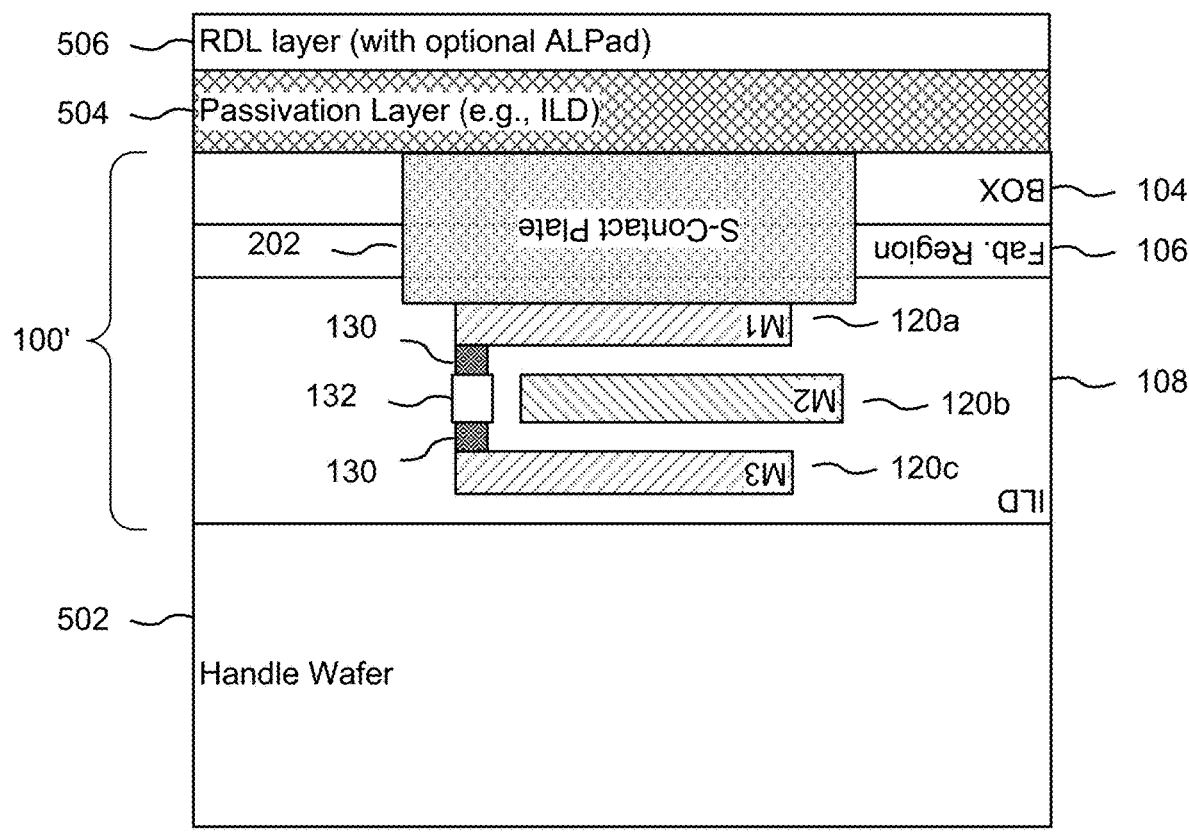
FIG. 5 is a stylized cross-sectional view of a SOI IC structure fabricated using an SLT process and having a stacked high-density integrated capacitor structure with S-contact fin capacitor plates.

For example, FIG. 5 is a stylized cross-sectional view of a SOI IC structure 500 fabricated using an SLT process and having a stacked high-density integrated capacitor structure with S-contact fin capacitor plates. Essentially, after most or all of the structure 100 of FIG. 2A or 2D is completed, the structure 100 is flipped over and attached or bonded in known fashion to a handle wafer 502, as shown in FIG. 5. Note that a passivation layer (not shown), such as $SiO_2$, may be applied on top of the structure 100 before flipping. Thereafter, the original substrate 102 is removed (e.g., by mechanical and/or chemical means), thus exposing the BOX layer 104. Accordingly, the original structure 100 has been reduced to a modified structure 100' by the removal of the substrate 102.

A non-conductive passivation layer 504 may be formed on the exposed BOX layer 104. The passivation layer 504 may be of conventional interlayer dielectric (ILD) material, such as silicon oxide, silicon nitride, tetraethyl orthosilicate (TEOS), or fluorinated tetraethyl orthosilicate (FTEOS). A redistribution layer (RDL) 506, often of copper or aluminum, may be fabricated over the passivation layer 504 to distribute high current power around an IC chip or to render high-Q inductors (and sometimes capacitors) for RF circuits. If copper is used for the RDL 506, or if copper vias or other structures are exposed in the passivation layer 504, then an aluminum layer (not separately shown) may be used as a capping layer to protect against oxidation of the copper. Thus, an aluminum layer may be both an RDL and a capping layer. Additional steps, not shown, may be performed for various applications.

Figure 6:
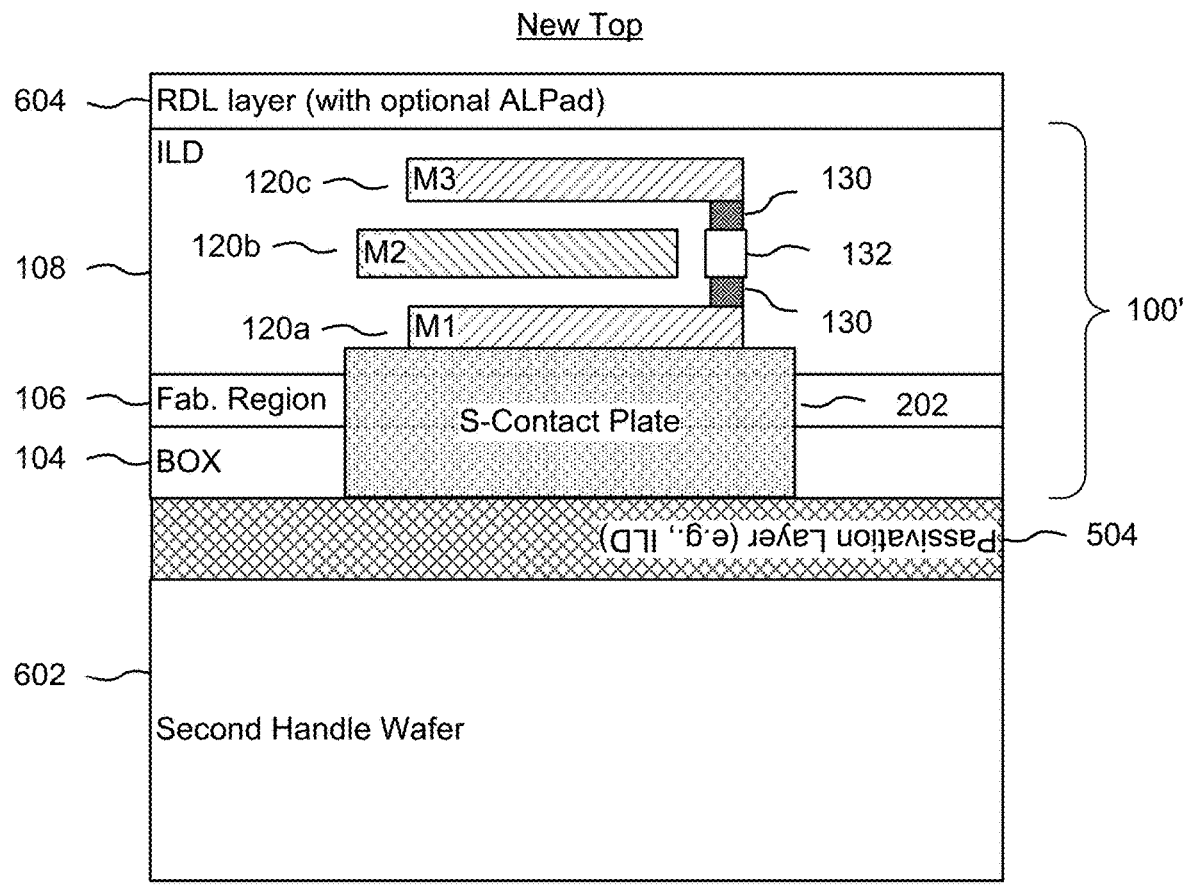
FIG. 6 is a stylized cross-sectional view of a SOI IC structure fabricated using a DLT process and having a stacked high-density integrated capacitor structure with S-contact fin capacitor plates.

FIG. 6 is a stylized cross-sectional view of a SOI IC structure 600 fabricated using a DLT process and having a stacked high-density integrated capacitor structure with S-contact fin capacitor plates. Essentially, nearly the entire structure shown in FIG. 5 (but omitting the RDL layer 506) is flipped over onto a second handle wafer 602, and the original handle waver 502 is removed. An RDL layer 604 may be added, and additional steps (not shown) may be performed for various applications.

As shown in FIGS. 5 and 6, the dielectric passivation layer 504 abuts the S-contact plates 202. If the actual structure 100 of the embodiment of FIG. 2A or of FIG. 2D is utilized to initiate the SLT or DLT processes, then the embodiments shown in FIGS. 5 and 6 will have the same increased capacitive density but a higher Q-factor than either non-layer transfer embodiment. The higher Q-factor results from elimination of all effects of the substrate 102 that may arise in the non-layer transfer SOI structures of FIGS. 2A and 2D.

As should be appreciated, the embodiments described with respect to FIG. 3 and FIG. 4 are also compatible with SLT and DLT fabrication processes and will similarly exhibit increased capacitive density and a high Q-factor.

While the SLT and DLT embodiments shown in FIGS. 5 and 6 required additional process steps compared to non-layer transfer SOI structures, the layer transfer structures provide added flexibility and design choices. As one example, for MOSFETs fabricated in conjunction with one or more integrated capacitor structures having S-contact fin capacitor plates, the RDL 506 of a layer transfer structure may be configured to control capacitive back channel parasitic effects by using a conductive aligned supplemental ("CAS") gate (not shown) formed as part of the RDL 506 over the passivation layer 504, as further described in the "Semiconductor-on-Insulator Transistor with Improved Breakdown Characteristics" patent application referenced and incorporated above.

As another example, additional capacitors may be formed in a layer transfer structure by using one or more metal interconnect layer regions and a portion of the RDL 506 as capacitor plates, as further described in the "SLT Integrated Circuit Capacitor Structure and Methods" patent application referenced and incorporated above. As should be appreciated, such additional capacitors may be internally connected to one or more integrated capacitor structures having S-contact fin capacitor plates by vias, metal interconnect layer signal lines, or other known means. Examples of such internal connections are described in the "SLT Integrated Circuit Capacitor Structure and Methods" patent application.

As yet another example, inductors may be formed in a layer transfer structure within one or more metal interconnect layer regions, as further described in the "High-Q Integrated Circuit Inductor Structure and Methods" patent application referenced and incorporated above. As should be appreciated, such inductors may be internally connected to one or more integrated capacitor structures having S-contact fin capacitor plates by vias, metal interconnect layer signal lines, or other known means. The ability to include high density capacitor structures in accordance with the present invention and inductors within the same IC provides numerous design possibilities for RF circuits, including filters, impedance matching networks, impedance conversion networks, time delay circuits, phase shifting circuits, etc.

Methods

Figure 7:
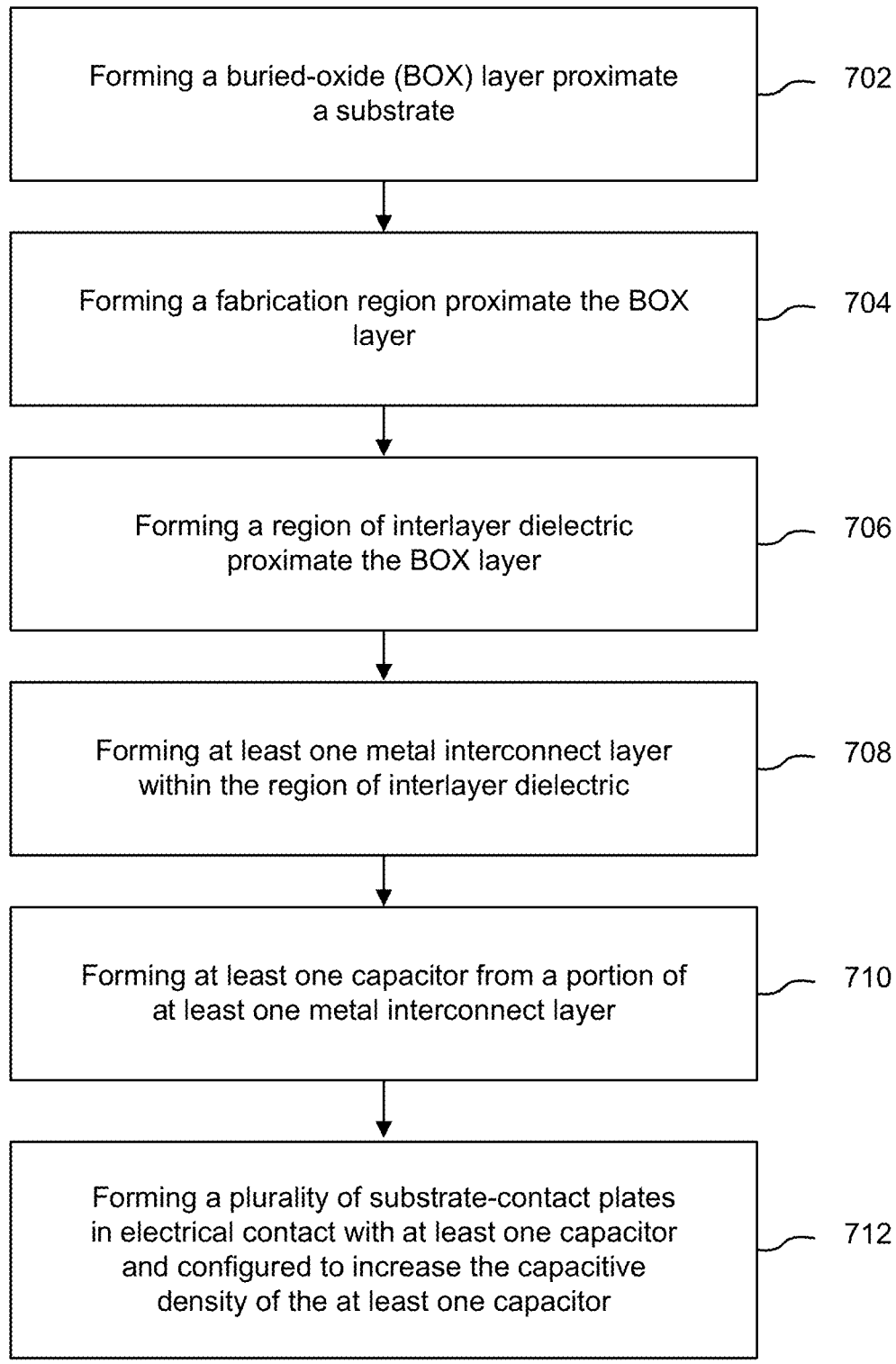
FIG. 7 is a process flow chart showing one method for fabrication of an integrated circuit that includes one or more integrated capacitor structures with S-contact capacitor plates.

Another aspect of the invention includes methods for fabrication of an integrated circuit that includes one or more integrated capacitor structures with S-contact capacitor plates. For example, FIG. 7 is a process flow chart 700 showing one method for fabrication of an integrated circuit that includes one or more integrated capacitor structures with S-contact capacitor plates, including: forming a buried-oxide (BOX) layer proximate a substrate (BLOCK 702); forming a fabrication region proximate the BOX layer (BLOCK 704); forming a region of interlayer dielectric proximate the BOX layer (BLOCK 706); forming at least one metal interconnect layer within the region of interlayer dielectric (BLOCK 708); forming at least one capacitor from a portion of at least one metal interconnect layer (BLOCK 710); and forming a plurality of substrate-contact (S-contact) plates in electrical contact with at least one capacitor and configured to increase the capacitive density of the at least one capacitor (BLOCK 712).

The above method may further include one or more of the following elements: wherein the S-contact plates penetrate through the fabrication region and the BOX layer to the substrate; wherein the S-contact plates penetrate through the fabrication region and partially penetrate the BOX layer; wherein at least one capacitor includes first and second lateral interdigitated structures; wherein at least one integrated capacitor structure includes a plurality of stacked lateral capacitors each comprising first and second interdigitated structures; wherein at least one lateral capacitor includes positive and negative interdigitated structures each having at least one finger, each finger aligned with and in electrical contract with a corresponding one of the plurality of S-contact plates; wherein at least one capacitor includes first and second lateral interdigitated structures each having at least one finger, each finger aligned with and in electrical contract with a corresponding one of the plurality of S-contact plates, and further including positioning at least one interstitial S-contact plate between adjacent fingers; forming at least one field effect transistor formed on and/or in the fabrication region; forming at least one field effect transistor having a conductive aligned supplemental gate; forming a redistribution layer, and forming at least one additional capacitor and/or inductor from a portion of the at least one metal interconnect layer and a portion of the redistribution layer; forming at least one inductor from a portion of the at least one metal interconnect layer; and/or forming the S-contact plates of a low resistivity conductive material.

As used in this specification, the term "proximate" means "close" or "very near"; "proximate" thus encompasses "adjoining" and "adjacent", but does not exclude intervening structures or layers that may somewhat space a first structure or element from a second structure or element, such as intermediate bonding layers, passivation layers, silicide layers, etc.

Fabrication Technologies & Options

In some fabrication processes, the conductive material used for making S-contacts may be of higher resistivity than the material used for making the metal interconnect layers. In such a case, the Q-factor of a particular integrated capacitor structure having S-contact fin capacitor plates 202 may be affected by design tradeoffs between maximum capacitance and maximum Q-factor. However, different materials used by different fabrication processes or in different process nodes may mitigate or eliminate this tradeoff. A person of ordinary skill in the art will recognize that this issue is an effect caused by specific materials used in specific fabrication processes and is not an inherent limitation of any of the embodiments of the current invention.

Other shapes compatible with a selected fabrication process can be used for the fingers 122a, 124a of a lateral capacitor and for the corresponding S-contact plates 202, such as concentric spirals (which may provide a desired level of inductance for an RF circuit).

The polarities described for the various capacitive elements and sub-elements of the embodiments described above are exemplary only, and other combinations of polarities for all the capacitive elements and sub-elements are possible and may be utilized to achieve a specified design requirement.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this specification, the term "radio frequency" (RF) refers a rate of oscillation in the range of about 3 kHz to about 300 GHz. This term also includes the frequencies used in wireless communication systems. An RF frequency may be the frequency of an electromagnetic wave or of an alternating voltage or current in a circuit.

As should be readily apparent to one of ordinary skill in the art, various embodiments of the invention can be implemented to meet a wide variety of specifications. In particular, one or more high-density integrated capacitor structures with S-contact capacitor plates in accordance with the present invention may be formed as part of an IC that optionally includes any combination of the following: one or more conventional FETs, one or more FETs configured with a conductive aligned supplemental (CAS) gate, one or more additional capacitors formed from a portion of at least one metal interconnect layer and a portion of the redistribution layer, and/or one or more inductors formed from a portion of at least one metal interconnect layer. Additional circuit components (e.g., resistors, diodes, external capacitors and/or inductors) may be added to or used in conjunction with such an IC to enhance the capabilities of the disclosed circuits and structures and/or to provide additional functionality without significantly altering the functionality of the disclosed circuits or structures.

Unless otherwise noted above, selection of suitable component values is a matter of design choice and various embodiments of the invention may be implemented in any suitable integrated circuit (IC) technology (including but not limited to MOSFET structures), or in hybrid or discrete circuit forms. Integrated circuit embodiments may be fabricated using any suitable semiconductor-on-insulator substrates and processes, including but not limited to silicon-on-insulator (SOI) and silicon-on-glass. Unless otherwise noted above, the invention may be implemented in other transistor technologies such as GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A method for fabrication of an integrated circuit, including:
   (a) forming a buried-oxide (BOX) layer proximate a substrate;
   (b) forming a fabrication region proximate the BOX layer;
   (c) forming a region of interlayer dielectric proximate the BOX layer;
   (d) forming at least one metal interconnect layer proximate the region of interlayer dielectric;
   (e) forming at least one lateral capacitor from a portion of at least one of the at least one metal interconnect layer; and
   (f) forming a plurality of substrate-contact (S-contact) plates in electrical contact with at least one of the at least one lateral capacitor and configured to increase the capacitive density of the at least one of the at least one lateral capacitor.

2. The method of claim 1, wherein the S-contact plates penetrate through the fabrication region and the BOX layer to the substrate.

3. The method of claim 1, wherein the S-contact plates penetrate through the fabrication region and partially penetrate the BOX layer.

4. The method of claim 1, wherein at least one lateral capacitor includes first and second lateral interdigitated structures.

5. The method of claim 1, wherein at least one lateral capacitor structure includes a plurality of stacked lateral capacitors each comprising first and second interdigitated structures.

6. The method of claim 1, wherein at least one lateral capacitor includes positive and negative interdigitated structures each having at least one finger, each finger aligned with and in electrical contract with a corresponding one of the plurality of S-contact plates.

7. The method of claim 1, wherein at least one capacitor includes first and second lateral interdigitated structures each having at least one finger, each finger aligned with and in electrical contract with a corresponding one of the plurality of S-contact plates, and further including positioning at least one interstitial S-contact plate between adjacent fingers.

8. The method of claim 1, further including forming at least one field effect transistor formed on and/or in the fabrication region.

9. The method of claim 1, further including forming at least one field effect transistor having a conductive aligned supplemental gate.

10. The method of claim 1, further including:
    (a) forming a redistribution layer; and
    (b) forming at least one additional capacitor and/or inductor from a portion of the at least one metal interconnect layer and a portion of the redistribution layer.

11. The method of claim 1, further including forming at least one inductor from a portion of the at least one metal interconnect layer.

12. The method of claim 1, further including forming the S-contact plates of a low resistivity conductive material.

* * * * *